(12) United States Patent
Yoshio et al.

(10) Patent No.: US 6,987,347 B2
(45) Date of Patent: Jan. 17, 2006

(54) PIEZOELECTRIC RESONATOR COMPONENT

(75) Inventors: Masakazu Yoshio, Toyama-ken (JP); Kenichi Kotani, Toyama-ken (JP); Mitsuhiro Yamada, Takaoka (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/819,297

(22) Filed: Apr. 7, 2004

(65) Prior Publication Data

US 2004/0251779 A1 Dec. 16, 2004

(30) Foreign Application Priority Data

May 30, 2003 (JP) .............................. 2003-154344
Mar. 4, 2004 (JP) .............................. 2004-061012

(51) Int. Cl.
*H03H 9/19* (2006.01)
(52) U.S. Cl. ..................... 310/320; 310/365; 310/344; 310/348; 310/325; 310/366
(58) Field of Classification Search ................ 310/320, 310/365, 366, 367, 358, 344, 348, 325
See application file for complete search history.

(56) References Cited

U.S. PATENT DOCUMENTS 6,232,699 B1 * 5/2001 Wajima ..................... 310/320

FOREIGN PATENT DOCUMENTS

| DE | 19922146 | * | 5/1999 |
| JP | 08-148967 | | 6/1996 |
| JP | 2003-087077 | | 3/2003 |

* cited by examiner

*Primary Examiner*—Darren Schuberg
*Assistant Examiner*—J. Aguirrechea
(74) *Attorney, Agent, or Firm*—Keating & Bennett, LLP

(57) ABSTRACT

A piezoelectric resonator component includes an energy-trapped piezoelectric resonator utilizing a third order harmonic wave of thickness longitudinal vibration and including a piezoelectric substrate having first and second major surfaces and polarized in a direction of thickness between the first and second major surfaces, and first and second vibrating electrodes opposed to each other with the piezoelectric substrate interposed therebetween, and first and second casing substrates respectively laminated on the first and second major surfaces of the piezoelectric resonator so that cavities are arranged so as not to interfere with vibration of a vibration section where the first and second vibrating electrodes face each other through the piezoelectric substrate. The first and second vibrating electrodes are dimensioned so that the difference between the peak values of the phases of S0 and S1 modes of the fundamental wave of the thickness longitudinal vibration falls within a range of about ±5 degrees.

14 Claims, 9 Drawing Sheets

PIEZOELECTRIC RESONATOR COMPONENT

BACKGROUND OF THE INVENTION

1. Field of the Invention

The present invention relates to energy-trapped piezoelectric resonator components and, in particular, to an energy-trapped piezoelectric resonator component that suppresses a fundamental wave of thickness longitudinal vibration functioning as a spurious wave.

2. Description of the Related Art

Energy-trapped piezoelectric resonators are in widespread use as oscillators. A variety of vibration modes are selectively used depending upon a target frequency.

Japanese Unexamined Patent Application Publication No. 8-148967 discloses an energy-trapped piezoelectric resonator 101 using the fundamental wave of thickness longitudinal vibration. As shown in a perspective view in FIG. 9, the known energy-trapped piezoelectric resonator 101 includes a piezoelectric substrate 102 having a rectangular planar shape. The piezoelectric substrate 102 is made of a piezoelectric ceramic that is polarized in the direction of thickness thereof. A vibrating electrode 103 having a circular planar shape is disposed on the top surface of the piezoelectric substrate 102, and an extension electrode 104 that extends from the vibrating electrode 103 is disposed on the top surface of the piezoelectric substrate 102. A vibrating electrode is also arranged on the bottom surface of the piezoelectric substrate 102 such that the vibrating electrode is opposed to the vibrating electrode 103. An extension electrode extends from the vibrating electrode.

An alternating current electric field is applied between the vibrating electrode 103 on the top surface and the vibrating electrode on the bottom surface of the piezoelectric substrate 102 in the energy-trapped piezoelectric resonator 101 to excite the thickness longitudinal vibration. Large spurious vibrations are caused by parasitic oscillation between the resonance frequency and the anti-resonance frequency of the thickness longitudinal vibration. To control the spurious vibration, paint films 105 and 106 made of an organic polymer containing a ceramic powder are disposed on at least one of the major surfaces of the energy-trapped piezoelectric resonator 101. The use of the paint films 105 and 106 increases the weight of the energy-trapped piezoelectric resonator 10, thereby controlling the parasitic oscillation and the spurious vibration.

The paint films 105 and 106 provide a damping effect to the parasitic oscillation in the use of the fundamental wave of thickness longitudinal vibration. In this technique, however, the paint films 105 and 106 must be applied, thereby increasing manufacturing steps and leading to a cost increase. When casing substrates are arranged on the top and bottom of the piezoelectric resonator 101, sealing performance deteriorates in the area of the piezoelectric substrate having the paint films 105 and 106 containing the ceramic powder applied thereto. The paint films 105 and 106 cause, due to the thickness thereof, difficulty in implementing a low-profile design in the piezoelectric resonator component. The paint films 105 and 106 cannot be uniformly applied because of the presence of the ceramic powder contained in the paint films 105 and 106, and thus, the paint films 105 and 106 fail to control the spurious wave in a stable manner.

Japanese Unexamined Patent Application Publication No. 2003-87077 discloses an energy-trapped piezoelectric resonator using a third order harmonic wave of the thickness longitudinal vibration. Circular vibrating electrodes are disposed on both major surfaces of a piezoelectric substrate having a rectangular planar shape such that the vibrating electrodes are opposed to each other with the piezoelectric substrate interposed therebetween. A damping material is arranged outside an area of the piezoelectric substrate where the vibrating electrodes are opposed. In the piezoelectric substrate, a thickness of the piezoelectric substrate "t" is set to be greater than a distance "L" between the external edge of the vibrating electrode and the damping material. With the damping effect of the damping material, the piezoelectric substrate excites a third order harmonic wave of the thickness longitudinal vibration while controlling the fundamental wave as a spurious wave.

The damping material is arranged to constrain the fundamental wave of the thickness longitudinal vibration in the piezoelectric resonator component working on the third order harmonic wave of the thickness longitudinal vibration. This known technique also takes advantage of the damping effect of the damping material, increasing manufacturing steps and leading to a cost increase.

Depending on variations in the location of the damping material, the damping effect also varies and stable control of the spurious wave is difficult.

SUMMARY OF THE INVENTION

To overcome the problems described above, preferred embodiments of the present invention provide a piezoelectric resonator component that eliminates the need for providing additional members such as a paint film and a damping member, simplifies manufacturing steps, reduces manufacturing costs, and has a structure that effectively and reliably controls the effect of the fundamental wave of the thickness longitudinal vibration in the use of the third order harmonic wave of the thickness longitudinal vibration.

A piezoelectric resonator component according to a preferred embodiment of the present invention includes an energy-trapped piezoelectric resonator utilizing a third order harmonic wave of thickness longitudinal vibration and including a piezoelectric substrate having first and second major surfaces and polarized in a direction of thickness between the first and second major surfaces, first and second vibrating electrodes opposed to each other with the piezoelectric substrate interposed therebetween, and first and second casing substrates respectively laminated on the first and second major surfaces of the piezoelectric resonator such that cavities are provided so as not to interfere with vibration of a vibration section where the first and second vibrating electrodes face each other through the piezoelectric substrate, wherein the first and second vibrating electrodes are dimensioned such that a difference between peak values of the phases of S0 and S1 modes of the fundamental wave of the thickness longitudinal vibration falls within a range of about ±5 degrees.

The piezoelectric resonator component according to this preferred embodiment of the present invention includes the first and second casing substrates that are respectively laminated on the first and second major surfaces of the piezoelectric resonator such that the cavities are provided so as not to interfere with vibration of a vibration section where the first and second vibrating electrodes are opposed to each other through the piezoelectric substrate. The piezoelectric substrate is an energy-trapped type that utilizes the third order harmonic wave of the thickness longitudinal vibration. Since the first and second vibrating electrodes are dimensioned such that the difference between the peak values of the phases of S0 and S1 modes of the fundamental wave of the thickness longitudinal vibration falls within a range of about ±5 degrees, the fundamental wave of the thickness longitudinal vibration is suppressed. The fundamental wave of the thickness longitudinal vibration is suppressed without incorporating additional members, such as a damping member or a paint film, and without affecting the third order harmonic wave of the thickness longitudinal vibration. Since the damping member and the paint film are not used, a miniature and thin design is achieved. The cost of the piezoelectric resonator component is also reduced.

In a preferred embodiment of the present invention, each of the first and second vibrating electrodes preferably has a substantially circular planar shape, the cavity preferably has a substantially square planar shape, and the relationship $R/t=0.40A/t+1.40$ to $0.33A/t+1.95$ is preferably maintained where R (in mm) represents the diameter of the substantially circular planar shape of the first and second vibrating electrodes, A (in mm) represents the length of each side of the substantially square planar shape of the cavity, and t (in mm) represents the thickness of the piezoelectric substrate.

If each of the first and second vibrating electrodes has a substantially circular planar shape, the cavity has a substantially square planar shape, and the relationship $R/t=0.40A/t+1.40$ to $0.33A/t+1.95$ is preferably maintained, the difference between the peak values of the phases of S0 and S1 modes of the fundamental wave of the thickness longitudinal vibration reliably falls within a range of about ±5 degrees. The fundamental wave of the thickness longitudinal vibration is effectively suppressed.

In another preferred embodiment of the present invention, each of the first and second vibrating electrodes has a substantially elliptical planar shape, the cavity has a substantially square planar shape, and the relationships $R_a/t=0.40A/t+1.40$ to $0.33A/t+1.95$ and $R_a= 2(S/\pi)^{1/2}$ are preferably maintained, where $R_a$ represents the dimension of the first and second electrodes, S (in mm²) represents the area of each of the first and second vibrating electrodes, A (in mm) represents the length of each side of the substantially square planar shape of the cavity, and t (in mm) represents the thickness of the piezoelectric substrate.

If each of the first and second vibrating electrodes has a substantially elliptical planar shape, and the cavity has a substantially square planar shape, and the relationships $R_a/t=0.40A/t+1.40$ to $0.33A/t+1.95$ and $R_a=2(S/\pi)^{1/2}$ are maintained, the difference between the peak values of the phases of S0 and S1 modes of the fundamental wave of the thickness longitudinal vibration reliably falls within a range of about ±5 degrees. The fundamental wave of the thickness longitudinal vibration is effectively suppressed.

In yet another preferred embodiment, each of the first and second vibrating electrodes has one of substantially circular and substantially elliptical planar shapes, the cavity has a substantially rectangular planar shape, and the relationships $R_a/t=0.40A_a/t+1.40$ to $0.33A_a/t+1.95$, $R_a=2S^{1/2}$ and $A_a=S_r^{1/2}$ are preferably maintained, where $R_a$ represents the dimension of the first and second electrodes, S (in mm²) represents the area of each of the first and second vibrating electrodes, $A_a$ represents the dimension of the cavity, $S_r$ (in mm²) represents the area of the substantially rectangular planar shape of the cavity, and t (in mm) represents the thickness of the piezoelectric substrate.

If each of the first and second vibrating electrodes has one of substantially circular and substantially elliptical planar shapes, the cavity has a substantially rectangular planar shape, and the relationships $R_a/t=0.40A_a/t+1.40$ to $0.33A_a/$ t+1.95, $R_a=2S^{1/2}$ and $A_a=S_r^{1/2}$ are preferably maintained, the fundamental wave of the thickness longitudinal vibration is effectively suppressed.

In a further preferred embodiment of the present invention, the first and second casing substrates have recesses on the respective surfaces thereof bonded to the energy-trapped piezoelectric resonator and the recesses form the cavities, respectively.

In a further preferred embodiment of the present invention, the first and second casing substrates are planar members, and the first and second casing substrates are bonded to the piezoelectric resonator by a bonding agent such that cavities are provided between each of the first and second casing substrates and the piezoelectric resonator.

If the first and second casing substrates have recesses on the respective surfaces thereof bonded to the energy-trapped piezoelectric resonator and the recesses provide the respective cavities, the fundamental wave of the thickness longitudinal vibration is effectively suppressed by controlling the dimension of the recesses. If the first and second casing substrates are made of the planar members, the first and second casing substrates are preferably bonded to the piezoelectric substrate using a bonding agent such that the cavities are provided between each of the first and second casing substrates and the piezoelectric substrate. In this case, the size of the cavity is dimensioned as previously described.

Other features, elements, characteristics, steps and advantages of the present invention will become more apparent from the following detailed description of preferred embodiments with reference to the attached drawings.

DETAILED DESCRIPTION OF PREFERRED EMBODIMENTS

Figure 1A:
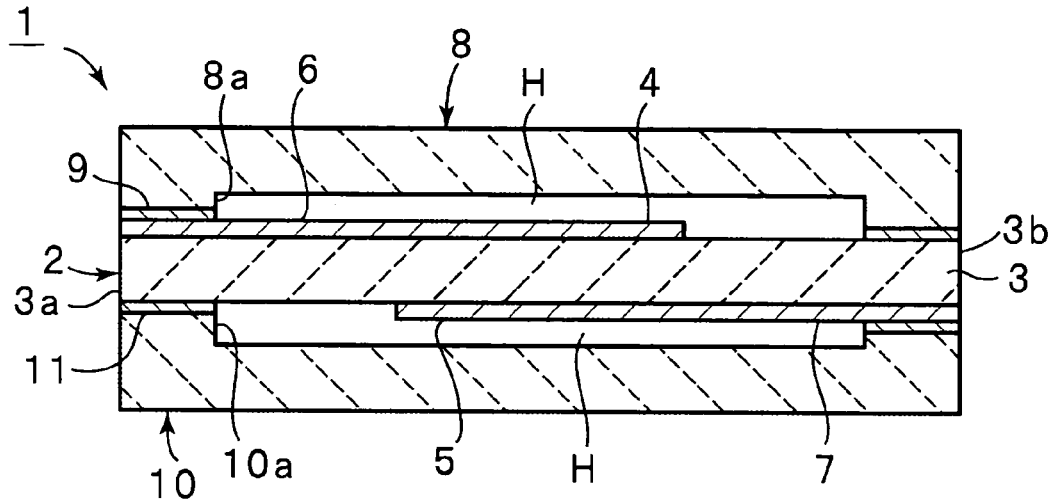
FIGS. 1A and 1B are respectively a longitudinal section and a perspective view of a piezoelectric resonator component of a first preferred embodiment of the present invention.

Referring to the drawings, preferred embodiments of the present invention will now be described.

Figure 1B:
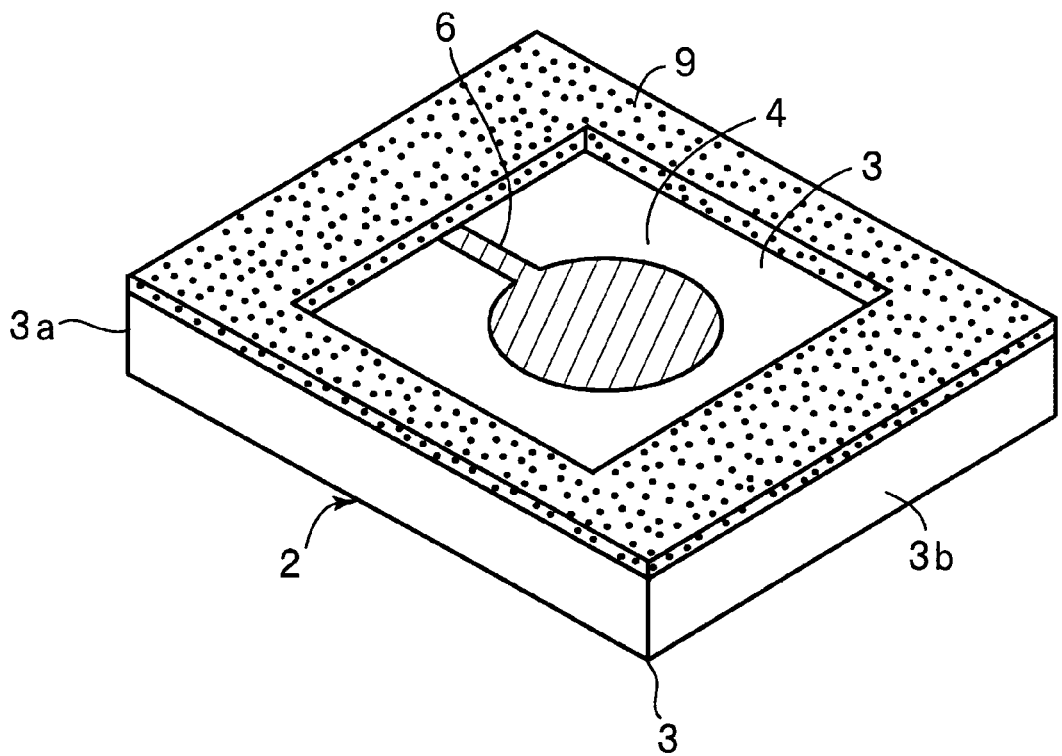

FIG. 1A is a longitudinal section of a piezoelectric resonator component 1 in accordance with a first preferred embodiment of the present invention and FIG. 1B is a perspective view of a major portion of the piezoelectric resonator component.

The piezoelectric resonator component 1 includes an energy-trapped piezoelectric resonator 2. The piezoelectric resonator 2 includes a piezoelectric substrate 3 having a substantially rectangular planar shape. The piezoelectric substrate 3, made of a piezoelectric ceramic, such as a lead zirconate titanate ceramic or a lead titanate ceramic, is polarized in the direction of thickness thereof.

A first vibrating electrode 4 having a substantially circular planar shape is disposed at the approximate center of the top surface of the piezoelectric substrate 3. A second vibrating electrode 5 is disposed on the bottom surface of the piezoelectric substrate 3 in a manner such that the second vibrating electrode 5 is opposed to the first vibrating electrode 4 with the piezoelectric substrate 3 interposed therebetween.

In the piezoelectric resonator 2, a first extension electrode 6 extends from the first vibrating electrode 4. Also, a second extension electrode 7 extends from the second vibrating electrode 5 on the bottom surface of the piezoelectric substrate 3. The first and second extension electrodes 6 and 7 respectively extend to mutually opposed end surfaces 3a and 3b of the piezoelectric substrate 3.

With an alternating current field applied between the first and second vibrating electrodes 4 and 5 in the piezoelectric resonator 2, the thickness longitudinal vibration mode is excited. The first preferred embodiment of the present invention utilizes a third order harmonic wave of the thickness longitudinal vibration.

Referring to FIG. 1A, a first casing substrate 8 is bonded to the top surface of the planar piezoelectric resonator 2 using a bonding agent layer 9. The first casing substrate 8 is preferably made of an insulating ceramic, such as alumina, and has a recess 8a on the bottom surface thereof. The recess 8a provides a cavity H such that the first casing substrate 0 does not interfere with the vibration of a vibrating section where the first vibrating electrode 4 and the second vibrating electrode 5 are opposed to each other.

A second casing substrate 10 is bonded to the bottom surface of the piezoelectric resonator 2 using a bonding agent layer 11. A recess 10a is provided on the top surface of the second casing substrate 10. The recess 10a is arranged to provide a cavity H below the vibrating section such that the second casing substrate 10 does not interfere with the vibration of the vibrating section.

The second casing substrate 10 is made of the same material as the first casing substrate 8.

FIG. 1B illustrates a perspective view of the piezoelectric resonator component 1 with the first and second casing substrates 8 and 10 and the lower bonding agent layer 11 removed.

The feature of the piezoelectric resonator component 1 in accordance with the first preferred embodiment of the present invention is that the first and second vibrating electrodes 4 and 5 are dimensioned such that the difference between the peak values of the phases of S0 mode and S1 mode of the fundamental wave of the thickness longitudinal vibration falls within a range of about ±5 degrees. As will be described with reference to the result of tests, the fundamental wave of the thickness longitudinal vibration is effectively suppressed without affecting the third order harmonic wave of the thickness longitudinal vibration. The test results are now specifically described.

The fundamental wave of the thickness longitudinal vibration has two modes, i.e., the S0 mode and the S1 mode. The peak values of the phase of the S0 and S1 modes are determined by the dimensions of the first and second vibrating electrodes 4 and 5, and the dimensions of the cavities H defined by the recesses 8a and 10a.

Figure 2:
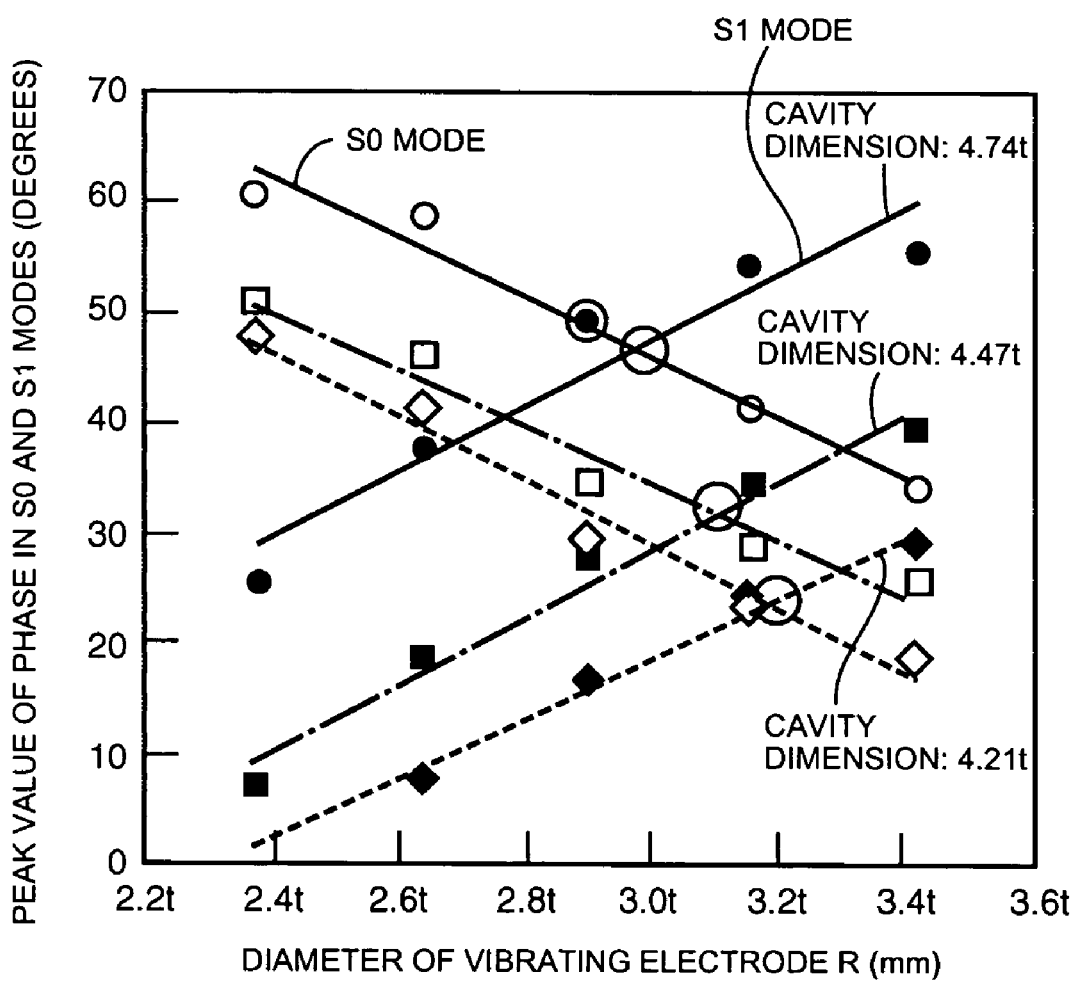
FIG. 2 plots the relationship between the peak values of the phases of S0 and S1 modes of the thickness longitudinal vibration of the energy-trapped piezoelectric resonator of the piezoelectric resonator component and the dimension of resonator electrodes in accordance with the first preferred embodiment of the present invention.

FIG. 2 shows how the peak value of the phase of the S0 mode and the peak value of the phase of the S1 mode vary with the dimensions of the first and second vibrating electrode 4 and 5. The piezoelectric resonator 2 is constructed so as to have a resonance frequency of about 20 MHz. The dimensions of the piezoelectric substrate 3 are, for example, about 3.7 mm long ×about 3.1 wide, ×about 0.38 mm thick. The diameter R (in mm) of each of the first and second vibrating electrodes 4 and 5 is varied. As shown, the test results of three piezoelectric resonators 2 having cavities H with the sides thereof being about 4.2t, about 4.47t, and about 4.7t are respectively represented by broken line, dot-and-dash chain line, and solid line where "t" represents the thickness of the piezoelectric substrate 3 in mm. As shown, lines slope downwards when going from left to right represent the results of the S0 mode, and lines slope upwards when going from left to right represent the results of the S1 mode.

As shown in FIG. 2, as the diameter R (in mm) of the first and second vibrating electrode 4 and 5 increases, the peak value of the phase of the S0 mode linearly decreases while the peak value of the phase of the S1 mode linearly increases. The peaks of the phases of the S0 and S1 modes also show a similar trend as the cavities H are changed. When the peak value of the phase of the S0 mode equals the peak value of the phase of the S1 mode, the response of the fundamental wave of the thickness longitudinal vibration is minimized.

Figure 3:
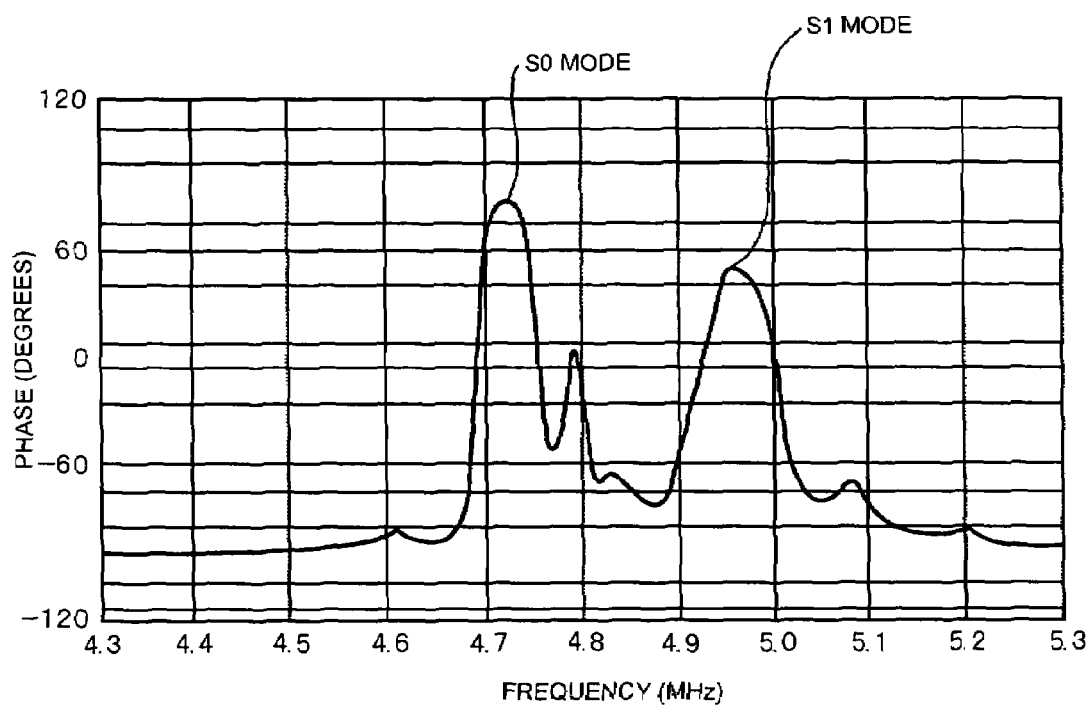
FIG. 3 plots phase versus frequency characteristic of a typical piezoelectric resonator with the peak value of the phase of the S0 mode greater than the peak value of the phase of the S1 mode.
Figure 4:
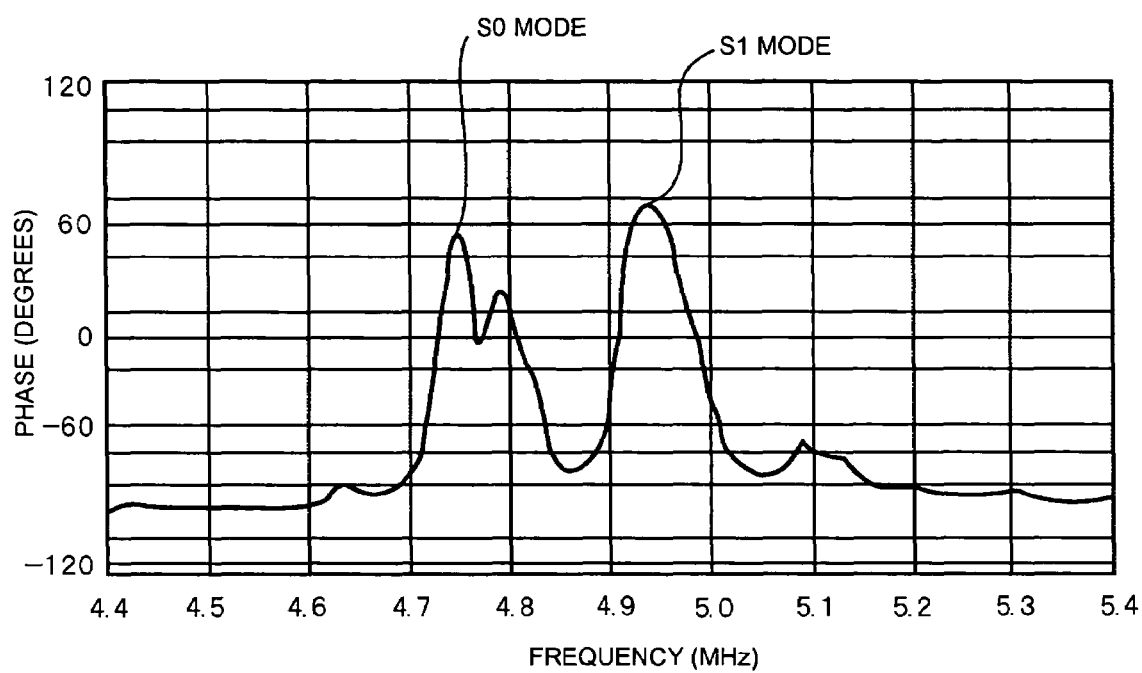
FIG. 4 plots phase versus frequency characteristic of a typical piezoelectric resonator with the peak value of the phase of the S0 mode greater than the peak value of the phase of the S1 mode.

FIG. 3 shows a typical frequency versus phase relationship of the piezoelectric resonator 2 wherein the peak value of the phase of the S0 mode is greater than the peak value of the phase of the S1 mode. FIG. 4 shows a typical frequency versus phase relationship of the piezoelectric resonator 2 wherein the peak value of the phase of the S0 mode is less than the peak value of the phase of the S1 mode. Referring to FIG. 2, the response in the fundamental wave of the thickness longitudinal vibration is minimized when the peak value of the phase of the S0 mode equals the peak value of the phase of the S1 mode. However, each of the peak value of the phase of the S0 mode and the peak value of the phase of the S1 mode is subject to an error range of about ±5 degrees. In accordance with preferred embodiments of the present invention, the fundamental wave of the thickness longitudinal vibration is sufficiently suppressed if the difference between the peak value of the phase of the S0 mode and the peak value of the phase of the S1 mode is set to be within a range of about ±5 degrees.

The reason why the peak value of the phase of the S0 mode and the peak value of the phase of the S1 mode vary in opposite directions with respect to the diameter of the vibrating electrodes is attributed to a difference between the vibration region of the phase of the S0 mode and the vibration region of the phase of the S1 mode. In terms of a displacement from a vibration peak position, the S1 mode results in a wider vibration region than the S0 mode. This means that the S1 mode is reduced more easily due to a package structure.

In the manufacturing stage of the piezoelectric resonator 2, the S0 mode is preferably smaller than the S1 mode. The S1 mode is then reduced by a package structure to equalize the peak value of the phase of the S0 mode to the peak value of the phase of the S1 mode. The fundamental wave of the thickness longitudinal vibration is thus effectively reduced.

The dimension R of the first and second vibrating electrode 4 and 5 and the dimensions of the cavities H in the package structure are determined such that the peak value of the phase of the S0 mode is smaller in the manufacturing stage of the piezoelectric resonator 2, and then the peak value of the phase of the S0 mode is equalized approximately to the peak value of the phase of the S1 mode by reducing the S1 mode by changing the package structure.

Figure 5:
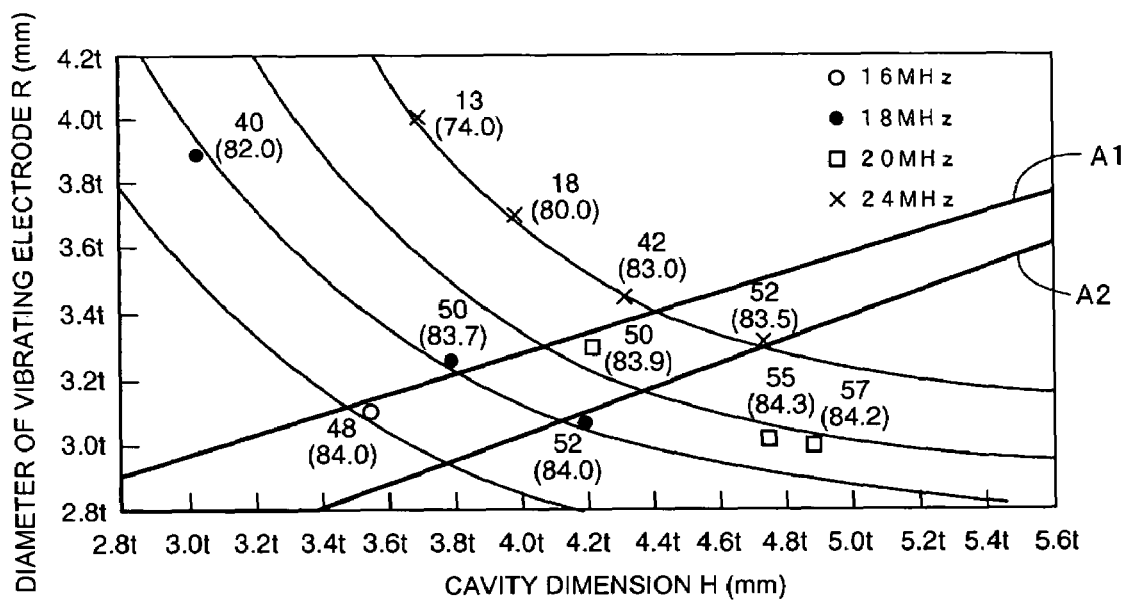
FIG. 5 illustrates the dimension A of a cavity of a piezoelectric resonator component and a plotted region where the difference between the phase peak value of the S0 mode and the phase peak value of the S1 mode with the diameter R of a vibrating electrode varying falls within a range of about ±5 degrees.

Piezoelectric resonator components having various resonance frequencies were produced with the diameter R (in mm) of the first and second vibrating electrode 4 and 5 and the dimensions A (in mm) of each side of the substantially square cavities H varied. The resonance frequencies of the piezoelectric resonator components were 16, 18, 20, and 24 MHz. The dimensional ranges of each of the piezoelectric resonator components were determined that kept the difference between the peak value of the phase of the S0 mode and the peak value of the phase of the S1 mode to within a range of about ±5 degrees. FIG. 5 shows the results of the test. As shown, four curvilinear lines plotted from left to right represent the test results of the piezoelectric resonator components having resonance frequencies of approximately 16, 18, 20, and 24 MHz, respectively. Numerals attached to the curvilinear lines represent the peak values of the phases of the S0 mode and the S1 mode of the fundamental wave of the thickness longitudinal vibration and parenthesized numerals represent the peak values of the phases of the third order harmonic waves.

FIG. 5 shows the range of the dimensions of the cavities H and the diameter R of the first and second vibrating electrodes 4 and 5 in the piezoelectric resonator component 1 of the first preferred embodiment of the present invention wherein the fundamental wave of the thickness longitudinal vibration is sufficiently suppressed and the third order harmonic wave is sufficiently excited. The range where the fundamental wave of the thickness longitudinal vibration is sufficiently suppressed is a range where the difference between the peak value of the phase of the S0 mode and the peak value of the phase of the S1 mode is kept to within a range of about ±5 degrees.

Referring to FIG. 5, a solid straight line A1 is expressed by y=0.33x+1.95t, and a solid line A2 is expressed by y=0.40x+1.40t, where "x" represents the length of each side "A" (in mm) of the substantially square cavity H, "y" represents the diameter "R" (in mm) of the first and second vibrating electrodes 4 and 5, and "t" represents the thickness of the piezoelectric substrate 3. In the region enclosed by the straight lines A1 and A2, the difference between the peak value of the phase of the S0 mode and the peak value of the phase of the S1 mode is kept to within a range of about ±5 degrees, and the fundamental wave of the thickness longitudinal vibration is effectively suppressed, while the third order harmonic wave of the fundamental wave of the thickness longitudinal vibration is sufficiently excited. In the region above the straight line A1, the third order harmonic wave is damped because the peak value of the phase of the third order harmonic wave is about 83 degrees or less. In the region below the straight line A2, the peak values of the phases of the S0 mode and the S1 mode are 52 degrees or more, and the suppression of the fundamental wave of the thickness longitudinal vibration is insufficient.

If the relationship R/t=0.40A/t+1.40 to 0.33A/t+1.95 is maintained, where R (in mm) represents the diameter of the substantially circular planar shape of the first and second vibrating electrodes, A (in mm) represents the length of each side of the substantially square planar shape of the cavity, and t (in mm) represents the thickness of the piezoelectric substrate, the third order harmonic wave of the thickness longitudinal vibration is excellently excited, while the fundamental wave of the thickness longitudinal vibration is sufficiently suppressed.

In the piezoelectric resonator 2 of the piezoelectric resonator component 1 of the first preferred embodiment of the present invention using the third order harmonic wave of the thickness longitudinal vibration, the peak value of the phase of the S0 mode of the fundamental wave of the thickness longitudinal vibration is preferably smaller than the peak value of the phase of the S1 mode. By changing the length of each side of the cavity "H" in the package structure, the peak value of the phase of the S1 mode is preferably smaller. In the piezoelectric resonator component 1, the difference between the peak value of the phase of the S0 mode and the vibration section of the S1 mode is preferably maintained to within a range of about +5 degrees. The fundamental wave of the thickness longitudinal vibration is effectively suppressed while the third order harmonic wave of the thickness longitudinal vibration is effectively used.

Figure 6:
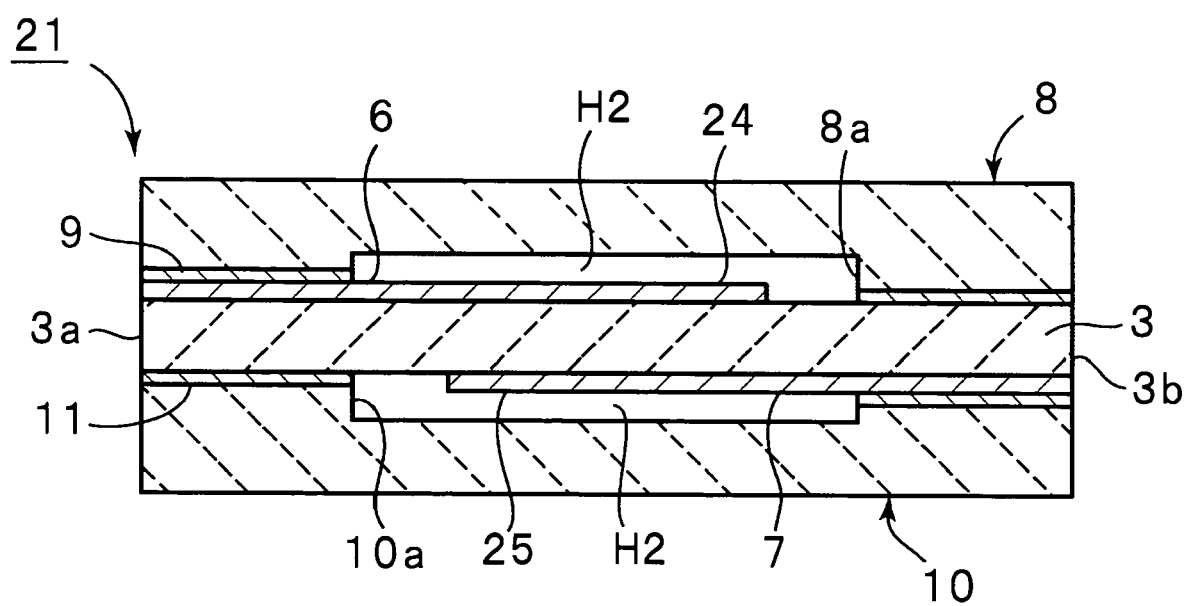
FIG. 6 is a frontal cross section of a piezoelectric resonator in accordance with a second preferred embodiment of the present invention.
Figure 7:
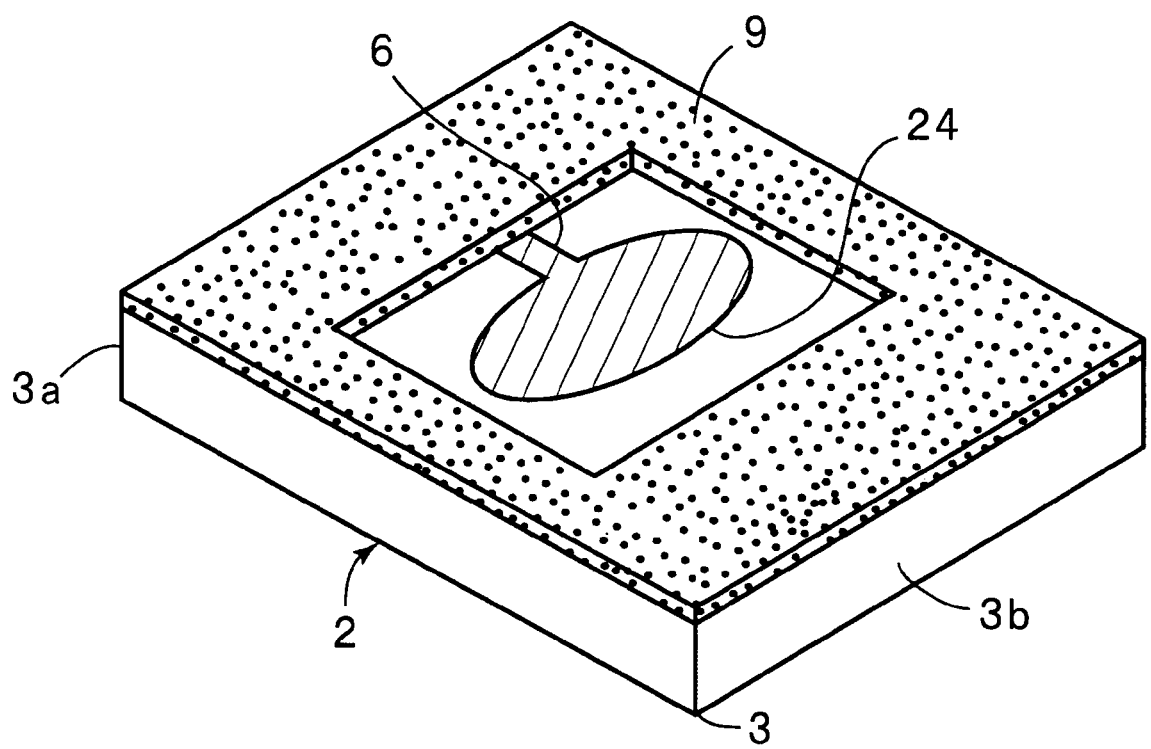
FIG. 7 is a perspective view of a major portion of the piezoelectric resonator component in accordance with the second preferred embodiment of the present invention.

FIG. 6 is a longitudinal section of a piezoelectric resonator component 21 in accordance with a second preferred embodiment of the present invention, and FIG. 7 is a perspective view of the piezoelectric resonator component 21. The piezoelectric resonator component 21 of the second preferred embodiment is identical to the piezoelectric resonator component 1 of the first preferred embodiment except that first and second vibrating electrode 24 and 25 have a substantially elliptical planar shape and that the cavity H has a substantially rectangular planar shape. Like elements are designated with like reference numerals, and the discussion thereof is omitted.

The piezoelectric resonator component of preferred embodiments of the present invention, as shown in FIGS. 6 and 7, may include the substantially elliptical first and second vibrating electrode 24 and 25 and the substantially rectangular cavity H. In this case, $2(S/\pi)^{1/2}$ is used for the dimension $R_a$ (in mm) of the first and second vibrating electrodes 24 and 25. Here, S (in mm$^2$) is the area of each of the first and second vibrating electrodes 24 and 25. Since the cavity H has a substantially rectangular planar shape, $A_a=S_r^{1/2}$ is used for the dimension $A_a$ (in mm) of the cavity H. Here, $S_r$ (in mm$^2$) represents the area of the planar shape of the cavity H.

Figure 8:
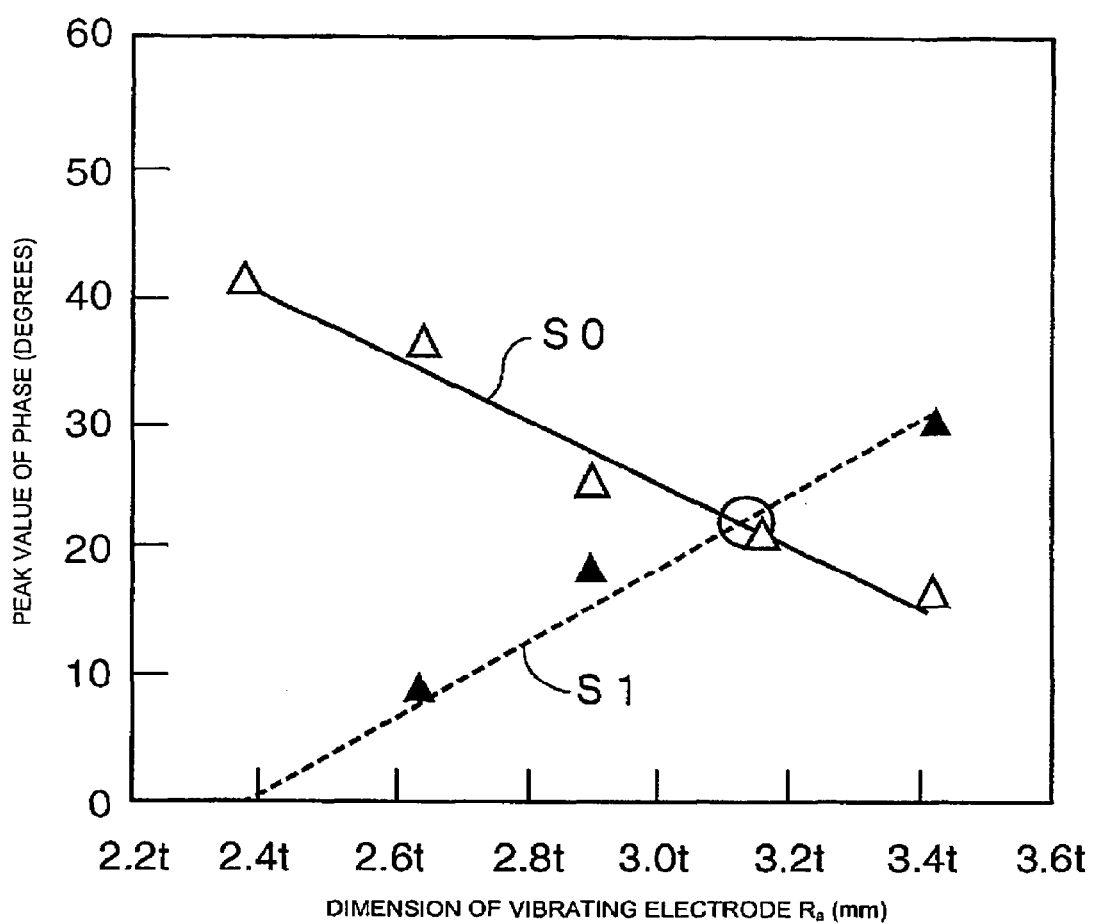
FIG. 8 plots the relationship between the peak values of the phases of S0 and S1 modes of the thickness longitudinal vibration of the piezoelectric resonator of the piezoelectric resonator component and the dimension of resonator electrodes in accordance with the second preferred embodiment of the present invention.
Figure 9:
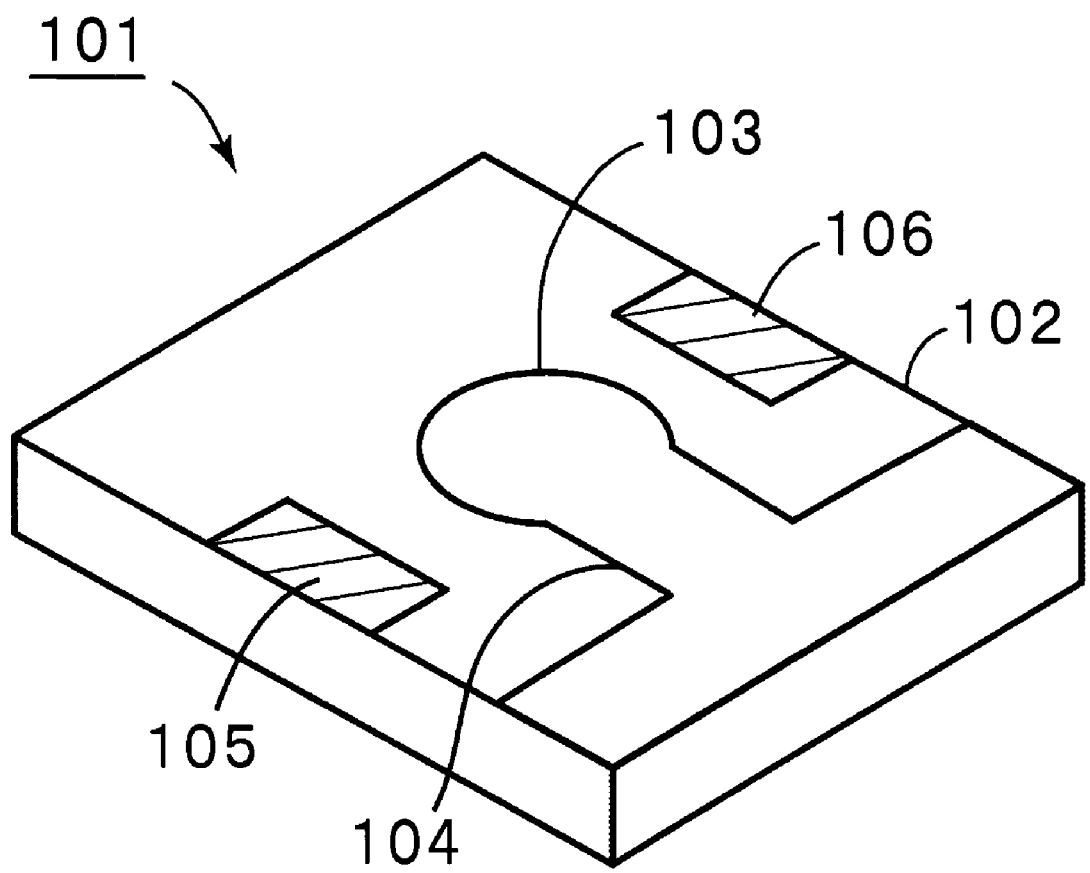
FIG. 9 is a perspective view illustrating a known energy-trapped piezoelectric resonator.

FIG. 8 shows the relationship between the dimension $R_a$ of the first and second vibrating electrodes 24 and 25 and the peak values of the phases of the S0 mode and the S1 mode in the energy-trapped piezoelectric resonator of the piezoelectric resonator component 21. As seen from FIG. 8, the peak values of the phases of the S0 mode and the S1 mode vary in opposite directions with respect to the dimension $R_a$ with the first and second vibrating electrodes 24 and having the substantially elliptical planar shape and the cavity H2 having the substantially rectangular planar shape. In comparison of FIG. 8 to FIG. 2, the use of the substantially elliptical first and second vibrating electrode 24 and 25 and the substantially rectangular cavities H2 results in the phase that is smaller at the intersection of the straight line representing the variation in the peak value of the phase of the S0 mode and the straight line representing the variation in the peak value of the phase of the S1 mode than the corresponding phase in FIG. 2. More specifically, the use of the substantially elliptical first and second vibrating electrode 24 and 25 and the substantially rectangular cavities H2 more effectively suppresses the fundamental wave of the thickness longitudinal vibration.

In accordance with the second preferred embodiment of the present invention, the peak values of the phases of the S0 mode and the S1 mode vary in mutually opposite directions with respect to the dimension of the vibrating electrodes. As in the first preferred embodiment of the present invention, the S0 mode is preferably smaller in the manufacturing phase of a piezoelectric resonator 22, and the S1 mode is reduced in the package structure. The difference between the peak value of the phase of the S0 mode and the peak value of the phase of the S1 mode is preferably within a range of about ±5 degrees. As in the first preferred embodiment, the fundamental wave of the thickness longitudinal vibration is effectively suppressed without affecting significantly the third order harmonic wave of the thickness longitudinal vibration.

If the cavity H2 has a substantially square planar shape in the second preferred embodiment of the present invention, the dimension A of the cavity may be set to be each side of the substantially square shape. If the first and second vibrating electrodes 24 and 25 have a substantially circular planar shape in the second preferred embodiment of the present invention, the dimension $R_a$ thereof may be the diameter R thereof.

With the relationship $R_a/t=0.40A_a/t+1.40$ to $0.33A_a/t+1.95$ held in the second preferred embodiment of the present invention, the difference between the peak value of the phase of the S0 mode and the peak value of the phase of the S1 mode is preferably within a range of about ±5 degrees.

In the first and second preferred embodiments of the present invention, the cavity is defined by a recess arranged in the casing substrate. Alternatively, the thickness of the bonding agent layers 9 and 11 may be increased and the cavity may be formed of a recess arranged in each of the bonding agent layers 9 and 11. In such a case, a planar substrate may be used for the casing substrate.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A piezoelectric resonator component comprising:
an energy-trapped piezoelectric resonator utilizing a third order harmonic wave of thickness longitudinal vibration and including a piezoelectric substrate having first and second major surfaces and being polarized in a direction of thickness between the first and second major surfaces, and first and second vibrating electrodes opposed to each other with the piezoelectric substrate interposed therebetween; and
first and second casing substrates respectively laminated on the first and second major surfaces of the piezoelectric resonator such that cavities are provided and arranged such that the first and second casing substrates do not interfere with vibration of a vibration section where the first and second vibrating electrodes face each other through the piezoelectric substrate; wherein
the first and second vibrating electrodes are dimensioned such that the difference between the peak values of the phases of S0 and S1 modes of the fundamental wave of the thickness longitudinal vibration falls within a range of about ±5 degrees, wherein the S0 mode is the symmetrical mode of the fundamental wave and the S1 mode is the symmetrical mode of the first harmonic wave of the fundamental wave;
each of the first and second vibrating electrodes has a substantially circular planar shape;
each of the cavities has a substantially square planar shape; and
a relationship R/t=0.40A/t+1.40 to 0.33A/t+1.95 is maintained where R represents a diameter of the substantially circular planar shape of the first and second vibrating electrodes, A represents a length of each side of the substantially square planar shape of the cavity, and t represents a thickness of the piezoelectric substrate.

2. A piezoelectric resonator component according to claim 1, wherein the first and second casing substrates have recesses provided on respective surfaces thereof bonded to the energy-trapped piezoelectric resonator and the recesses define the cavities, respectively.

3. A piezoelectric resonator component according to claim 1, wherein the first and second casing substrates are planar members, and the first and second casing substrates are bonded to the piezoelectric resonator by a bonding agent such that cavities are provided between each of the first and second casing substrates and the piezoelectric resonator.

4. A piezoelectric resonator component according to claim 1, wherein the piezoelectric substrate is substantially rectangular.

5. A piezoelectric resonator component comprising:
an energy-trapped piezoelectric resonator utilizing a third order harmonic wave of thickness longitudinal vibration and including a piezoelectric substrate having first and second major surfaces and being polarized in a direction of thickness between the first and second major surfaces, and first and second vibrating electrodes opposed to each other with the piezoelectric substrate interposed therebetween; and
first and second casing substrates respectively laminated on the first and second major surfaces of the piezoelectric resonator such that cavities are provided and arranged such that the first and second casing substrates do not interfere with vibration of a vibration section where the first and second vibrating electrodes face each other through the piezoelectric substrate; wherein
the first and second vibrating electrodes are dimensioned such that the difference between the peak values of the phases of S0 and S1 modes of the fundamental wave of the thickness longitudinal vibration falls within a range of about ±5 degrees, wherein the S0 mode is the symmetrical mode of the fundamental wave and the S1 mode is the symmetrical mode of the first harmonic wave of the fundamental wave;
each of the first and second vibrating electrodes has a substantially elliptical planar shape;
each of the cavities has a substantially square planar shape; and relationships $R_a/t=0.40A/t+1.40$ to $0.33A/t+1.95$ and $R_a=2(S/\pi)^{1/2}$ are maintained, where $R_a$ represents a dimension of the first and second electrodes, S represents an area of each of the first and second vibrating electrodes, A represents a length of each side of the substantially square planar shape of the cavity, and t represents the thickness of the piezoelectric substrate.

6. A piezoelectric resonator component according to claim 5, wherein the first and second casing substrates have recesses provided on respective surfaces thereof bonded to the energy-trapped piezoelectric resonator and the recesses define the cavities, respectively.

7. A piezoelectric resonator component according to claim 5, wherein the first and second casing substrates are planar members, and the first and second casing substrates are bonded to the piezoelectric resonator by a bonding agent such that cavities are provided between each of the first and second casing substrates and the piezoelectric resonator.

8. A piezoelectric resonator component according to claim 5, wherein the piezoelectric substrate is substantially rectangular.

9. A piezoelectric resonator component comprising:

an energy-trapped piezoelectric resonator utilizing a third order harmonic wave of thickness longitudinal vibration and including a piezoelectric substrate having first and second major surfaces and being polarized in a direction of thickness between the first and second major surfaces, and first and second vibrating electrodes opposed to each other with the piezoelectric substrate interposed therebetween; and first and second casing substrates respectively laminated on the first and second major surfaces of the piezoelectric resonator such that cavities are provided and arranged such that the first and second casing substrates do not interfere with vibration of a vibration section where the first and second vibrating electrodes face each other through the piezoelectric substrate; wherein the first and second vibrating electrodes are dimensioned such that the difference between the peak values of the phases of S0 and S1 modes of the fundamental wave of the thickness longitudinal vibration falls within a range of about ±5 degrees, wherein the S0 mode is the symmetrical mode of the fundamental wave and the S1 mode is the symmetrical mode of the first harmonic wave of the fundamental wave;

each of the first and second vibrating electrodes has one of a substantially circular shape and a substantially elliptical planar shape;

each of the cavities has a substantially rectangular planar shape; and relationships $R_a/t=0.40A_a/t+1.40$ to $0.33A_a/t+1.95$, $R_a=2S^{1/2}$ and $A_a=S_r^{1/2}$ are maintained, where $R_a$ represents a dimension of the first and second electrodes, S represents an area of each of the first and second vibrating electrodes, $A_a$ represents a dimension of the cavity, $S_r$ represents an area of the substantially rectangular planar shape of the cavity, and t represents the thickness of the piezoelectric substrate.

10. A piezoelectric resonator component according to claim 9, wherein the first and second casing substrates have recesses provided on respective surfaces thereof bonded to the energy-trapped piezoelectric resonator and the recesses define the cavities, respectively.

11. A piezoelectric resonator component according to claim 9, wherein the first and second casing substrates are planar members, and the first and second casing substrates are bonded to the piezoelectric resonator by a bonding agent such that cavities are provided between each of the first and second casing substrates and the piezoelectric resonator.

12. A piezoelectric resonator component according to claim 9, wherein the piezoelectric substrate is substantially rectangular.

13. A piezoelectric resonator component according to claim 9, wherein the first and second vibrating electrodes are substantially circular planar shape.

14. A piezoelectric resonator component according to claim 9, wherein the first and second vibrating electrodes are substantially elliptical planar shape.

* * * * *